United States Patent [19]
Makki et al.

[11] Patent Number: 5,216,359
[45] Date of Patent: Jun. 1, 1993

[54] ELECTRO-OPTICAL METHOD AND APPARATUS FOR TESTING INTEGRATED CIRCUITS

[75] Inventors: Rafic Z. Makki; Kasra Daneshvar; Farid M. Tranjan; Richard F. Greene, all of Charlotte, N.C.

[73] Assignee: University of North Carolina, Charlotte, N.C.

[21] Appl. No.: 644,038

[22] Filed: Jan. 18, 1991

[51] Int. Cl.$^5$ .................................. G01R 31/28
[52] U.S. Cl. ............................ 324/158 R; 324/96; 358/106
[58] Field of Search ........... 324/158 D, 158 T, 158 R, 324/72.5, 96; 358/10, 106, 139

[56] References Cited

U.S. PATENT DOCUMENTS

| | | |
|---|---|---|
| 3,663,194 | 5/1972 | Greenstein et al. ............ 250/213 A |
| 3,934,199 | 1/1976 | Channin . |
| 3,956,698 | 5/1976 | Malmberg et al. . |
| 4,053,833 | 10/1977 | Malmberg et al. . |
| 4,415,851 | 11/1983 | Langner et al. . |
| 4,554,453 | 11/1985 | Feigt et al. ..................... 250/213 R |
| 4,681,449 | 7/1987 | Bloom et al. . |
| 4,703,260 | 10/1987 | Beha et al. . |
| 4,714,826 | 12/1987 | Goutzoulis . |
| 4,745,361 | 5/1988 | Nees et al. . |
| 4,758,092 | 7/1988 | Heinrich et al. . |
| 4,760,249 | 7/1988 | Baskett . |
| 4,786,864 | 11/1988 | Beha et al. . |
| 4,816,755 | 3/1989 | Look et al. . |
| 4,827,212 | 5/1989 | Kamieniecki . |
| 4,843,329 | 6/1989 | Beha et al. . |
| 4,868,492 | 9/1989 | Beha et al. ..................... 324/158 R |
| 4,881,029 | 11/1989 | Kawamura . |
| 4,482,863 | 6/1990 | Auston et al. .................. 324/158 D |
| 4,896,109 | 1/1990 | Rauscher ........................ 324/158 D |
| 4,933,634 | 6/1990 | Cuzin et al. .................... 324/158 R |
| 4,970,461 | 11/1990 | LePage ........................... 324/158 R |
| 4,999,577 | 3/1991 | Beha et al. ..................... 324/158 R |
| 5,059,897 | 10/1991 | Aton et al. ..................... 324/158 T |

OTHER PUBLICATIONS

*Practical Partitioning for Testability with Time-Shared Boundary Scan*, Makki et al., 1990 International Test Conference, Sep. 10-14, 1990, Paper 42.3, pp. 970-977.
*Comparison between Optical and Electrical Interconnects Based on Power and Speed Considerations*, Feldman et al., Applied Optics, vol. 27, pp. 1742-1751, May 1, 1988.
*Timing Uncertainty for Receivers in Optical Clock Distribution for VLSI*, Clymer et al., Optical Engineering, Nov. 1988, vol. 27, No. 11, pp. 944-954.
*Measurement of GaAs Field-Effect Transistor Electronic Impulse Reponse by Picosecond Optical Electronics*, Smith et al., Appl. Phys. Lett., 39(9), Nov. 1, 1981, pp. 739-741.
*Optical Clock Distribution to Silicon Chips*, Clymer et al., Optical Engineering, Oct. 1986, vol. 25, No. 10, pp. 1103-1108.
*Holographic Optical Interconnects for VLSI*, Bergman et al., Optical Engineering, Oct. 1986, vol. 25, No. 10, pp. 1109-1117.

*Primary Examiner*—Ernest F. Karlsen
*Assistant Examiner*—William J. Burns
*Attorney, Agent, or Firm*—Bell, Seltzer, Park & Gibson

[57] ABSTRACT

Internal test sites on integrated circuit chips may be tested with minimal input/output pad or chip area overhead by providing transient interconnections to the internal test sites using an optically activated photoconductive layer which is formed over the active device layers of the integrated circuit to be tested. The photoconductive layer may be optically activated using an optical mask or hologram, to electrically access the desired internal test sites. Different test sites may be tested using different masks or holograms. The photoconductive layer is preferably hydrogenated amorphous silicon which is highly compatible with standard integrated circuit processing.

42 Claims, 6 Drawing Sheets

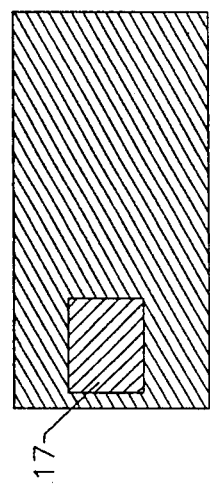
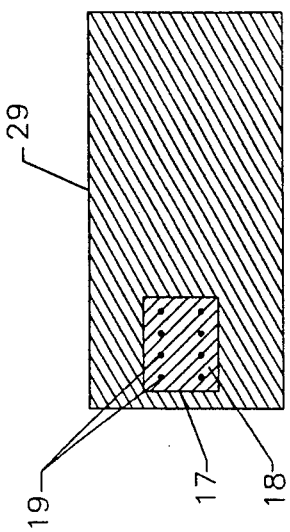
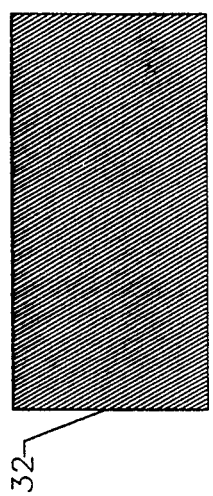
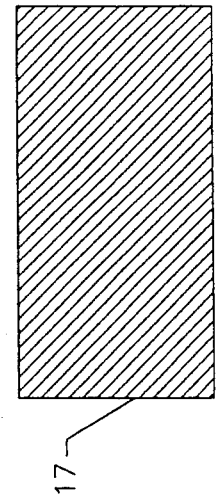
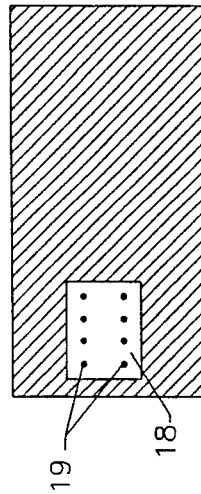
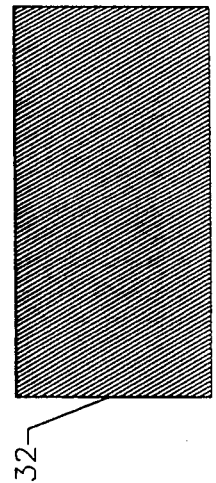
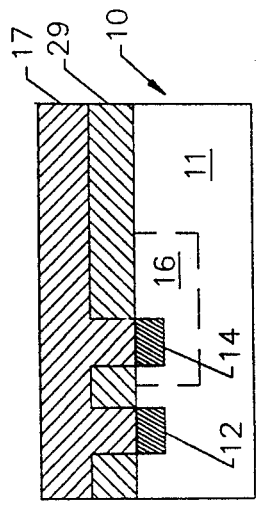
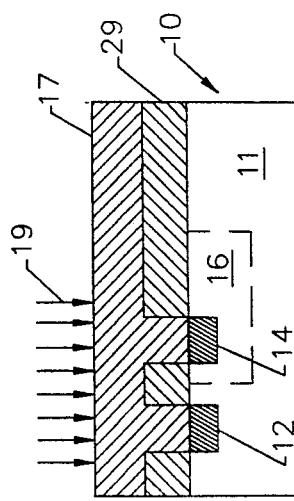
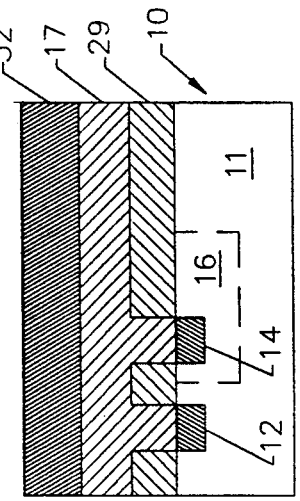

ELECTRO-OPTICAL METHOD AND APPARATUS FOR TESTING INTEGRATED CIRCUITS

FIELD OF THE INVENTION

This invention relates to the manufacture of integrated circuit devices, and more particularly to a method and apparatus for testing integrated circuits during or after their manufacture to insure that a functional integrated circuit has been produced.

BACKGROUND OF THE INVENTION

Integrated circuits, also referred to as "chips", typically include logic chips, memory chips, combined logic and memory chips such as microprocessor chips, and other chips. Wafer size integrated circuits have also been proposed. In the present state of the art integrated circuits have become very complex. For example, an Ultra Large Scale Integration (ULSI) chip may include several million devices thereon.

As the manufacture of integrated circuits has become more complex, testing of integrated circuits has also become more difficult due to the large number of interconnected devices thereon. In fact, in the present state of the art, testing consumes significant portions of the development cost of any new integrated circuit.

Testing of high density integrated circuits has become increasingly difficult because testing cannot typically rely on the external input and output (I/O) pins or pads of the integrated circuit. In other words, to fully test the integrated circuit within a reasonable amount of time, access to internal sites of the integrated circuit are necessary. Internal sites must be accessed in order to apply internal test signals and to measure responses to the internal test signals.

The art has developed a number of techniques for accessing the internal sites of an integrated circuit. Unfortunately, each of these techniques impacts the manufacture or operation of the integrated circuit. For example, some integrated circuits have included a large number of test I/O pins which permit access to internal sites of the integrated circuit. Unfortunately, the need for test I/O pins limits the number of active pins that can be provided for normal operations. As the size of the integrated circuit devices shrinks and the number of devices per number of pins increases, it is more difficult to provide many separate test pins.

Other approaches have used an internal "scan path" to thread registers throughout an integrated circuit to form a large serial shift register. The shift register can be used for transferring test data to internal sites of the circuit. Unfortunately, the shift registers and their control circuits consume some of the active chip area ("real estate") and thereby limit the real estate available for normal integrated circuit functions. The shift registers and their control circuits can also degrade chip performance, by adding capacitive loading to the integrated circuit during normal operations. The scan path method also serializes the test process, and typically results in large test vector sets which increases the test application time. Chip partitioning approaches have also been used to partition the active circuitry in the chip into a number of subcircuits for accessing the internal sites. Again, however, partitioning requires additional test pins and/or internal test circuitry thereby limiting performance.

The art has attempted to provide access to internal sites without an undue real estate or I/O pin penalty by using optical testing techniques. For example, U.S. Pat. No. 4,053,833 to Malmberg et al. describes a contactless integrated circuit testing technique in which a number of photodiode switches are fabricated in the integrated circuit. The photodiodes allow the integrated circuit to be tested in terms of partitioned modules. One or more light beams are used to selectively adapt the photodiodes to conduct. Unfortunately, this approach is not practical for high density integrated circuits because too much real estate is occupied and capacitive loading is produced by the photodiodes themselves, and because it is often not feasible to fabricate photodiodes on the same chip as high density logic and memory devices.

In an article entitled *Holographic Optical Interconncts for VLSI*, published in Optical Engineering, Vol. 25, No. 10, Oct. 1986, pp. 1109-1117, Bergman et al. suggest that microcircuit testing techniques based on optical access to specific locations on a chip can be developed. In fact, holograms have been used to program a logic array, as shown in U.S. Pat. No. 4,760,249 to Baskett entitled *Logic Array Having Multiple Optical Logic Inputs*, and holograms have been used for optical clock distribution in an integrated circuit as described in an article entitled *Optical Clock Distribution to Silicon Chips*, published in Optical Engineering, Vol. 25, No. 10, Oct. 1986, pp. 1103-1108 by Clymer et al.

In conclusion, while the art has suggested that optical techniques may be used to enhance the testability of high density integrated circuits, to the best of Applicants' knowledge the art has not heretofore suggested an electro-optical method and apparatus for testing integrated circuits which requires little overhead in terms of test pins, chip real estate, or performance degradation.

SUMMARY OF THE INVENTION

It is therefore an object of the invention to provide an improved method and apparatus for testing integrated circuits.

It is yet another object of the present invention to provide a method and apparatus for testing integrated circuits which provides access to internal circuit sites without significant input/output or chip area penalty, or significant performance degradation.

It is still another object of the present invention to provide a method and apparatus for testing integrated circuits using a combination of electrical and optical techniques which is compatible with conventional integrated circuit manufacturing processes.

These and other objects are provided according to the present invention by providing "virtual" or "transient" interconnects between input/output (I/O) points and internal test sites of an integrated circuit chip using an optically activated photoconductive layer (i.e. a layer which becomes electrically conductive in response to optical activation) which is formed over the active device layers of the chip. The photoconductive layer may be optically activated using an optical mask or a hologram to electrically connect the desired internal test sites on the integrated circuit with external I/O pins or pads so that the input and output pins may be used to test the selected test sites. After the selected test sites are tested, optical activation is terminated to electrically disconnect the selected test sites from the external I/O pads and/or from each other.

Since the optically activated interconnection network is separate from the active circuitry of the chip, minimal chip area is occupied by the interconnects. Moreover, since different masks and/or holograms may be used to connect different internal sites to the I/O pins, a minimum number of I/O pins are necessary. Accordingly, simplified access to internal sites of the integrated circuit may be provided without paying an undue I/O pin or test circuit overhead penalty.

In particular, according to the present invention, an integrated circuit includes a plurality of electronic devices for performing predetermined integrated circuit functions and a plurality of internal test sites for providing electrical connections to selected ones of the electronic devices. The integrated circuit also includes a test input signal receiver and a test output signal receiver in the form of pins, pads or other regions. The integrated circuit also typically includes a "test select" pad for selecting test mode or normal operations. The integrated circuit also includes means for photoconductively connecting the test input receiver, the test output receiver and the internal test sites, so that selected portions of the photoconductive connecting means can be optically activated to electrically connect the test input receiving means, the test output receiving means and selected ones of the internal test sites. After testing, optical activation of the selected portions of the photoconductive connecting means is terminated, to thereby electrically disconnect the selected ones of the internal test sites from the test input receiving means and test output receiving means. Different portions of the photoconductive connecting means may be activated and then deactivated, to test different internal test sites and the corresponding devices connected thereto.

In a preferred embodiment of the present invention the photoconductive connecting means includes an insulating layer having a plurality of vias therein for exposing the test input pin, the test output pin and the plurality of internal test sites. A solid or patterned photoconductive layer is then formed on the insulating layer with the photoconductive layer filling the vias and connecting the filled vias to one another. Preferably, the photoconductive layer is a layer of hydrogenated amorphous silicon.

Then, in order to test the integrated circuit having the photoconductive layer thereon, a first portion of the photoconductive layer is optically activated to form first electrical interconnections among the test input, the test output and first selected ones of the internal test sites. The photoconductive layer may be optically activated by passing light through a mask adjacent the photoconductive layer to thereby optically irradiate the first portion of the photoconductive layer. Alternatively, a hologram may be used to optically irradiate the first portion of the photoconductive layer.

Once the first portion of the photoconductive layer is irradiated, the first portion acts as an electrical conductor between the selected ones of the internal test sites, the test input and the test output. The electrical devices which are connected to the first internal test sites may then be tested by applying test inputs via the test input pin and measuring the test results via the test output pin. The first portion of the photoconductive layer is then deactivated by terminating the irradiation thereof. The optically activating, testing, and deactivating steps may then be repeated for different ones of the internal test sites using a different mask or hologram to optically activate different portions of the photoconductive layer. After testing is complete, the photoconductive layer may be removed or encapsulated to prevent further optical activation.

The photoconductive layer of the present invention may be formed of hydrogenated amorphous silicon which is highly compatible to standard microelectronic manufacturing techniques and processes. Moreover, the optically activated layer is preferably formed on top of the active device regions and metallization regions of the integrated circuit so that the optical layer consumes no additional real estate. By allowing transient or virtual electrical interconnections, a single input and output pin or a small number of input and output pins may be selectively connected to the desired internal test sites for testing purposes. Accordingly, the number of input/output pins required for testing purposes is minimized.

The testing method and apparatus of the present invention may be incorporated into a standard test station by providing a plurality of masks, in the form of optical masks or holograms, which are individually movable adjacent to the test station. An appropriate mask may be moved adjacent the integrated circuit and irradiated to activate selected portions of the photoconductive layer to photoconductively electrically connect a first group of internal test sites to one or more input pads and output pads. Then the test station may apply appropriate test signals to the input pad and receive appropriate output signals from the output pad to test the internal sites of the integrated circuit. Irradiation is then terminated to deactivate the electrical connection to the first group of internal test sites. After this test is performed, a second mask is moved adjacent a chip and is irradiated, and a second set of inputs are applied and outputs are received. This process continues until all internal sites of the chip are tested.

The test method and apparatus of the present invention is compatible with known chip partitioning techniques for partitioning a complicated circuit into simpler circuits for testing purposes. Accordingly, known partitioning techniques may be used to partition the circuit and to generate test data for internal sites of the circuit. The photoconductive interconnection technique of the present invention may then be used to access the partitioned circuits and to provide the test data. Accordingly, the present invention is highly compatible with integrated circuit manufacturing techniques and known partitioning techniques to provide low cost, low overhead testing of integrated circuits.

BRIEF DESCRIPTION OF THE DRAWINGS

FIGS. 3A-3F illustrate cross-sectional views of a sequence of steps for manufacturing an integrated circuit having a photoconductive layer thereon according to the present invention.

FIGS. 4A-4F illustrate top views of the corresponding cross-sectional views of FIG. 3.

FIGS. 5A-5F illustrate top views of an alternative embodiment for manufacturing an integrated circuit having a photoconductive layer thereon according to the present invention.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
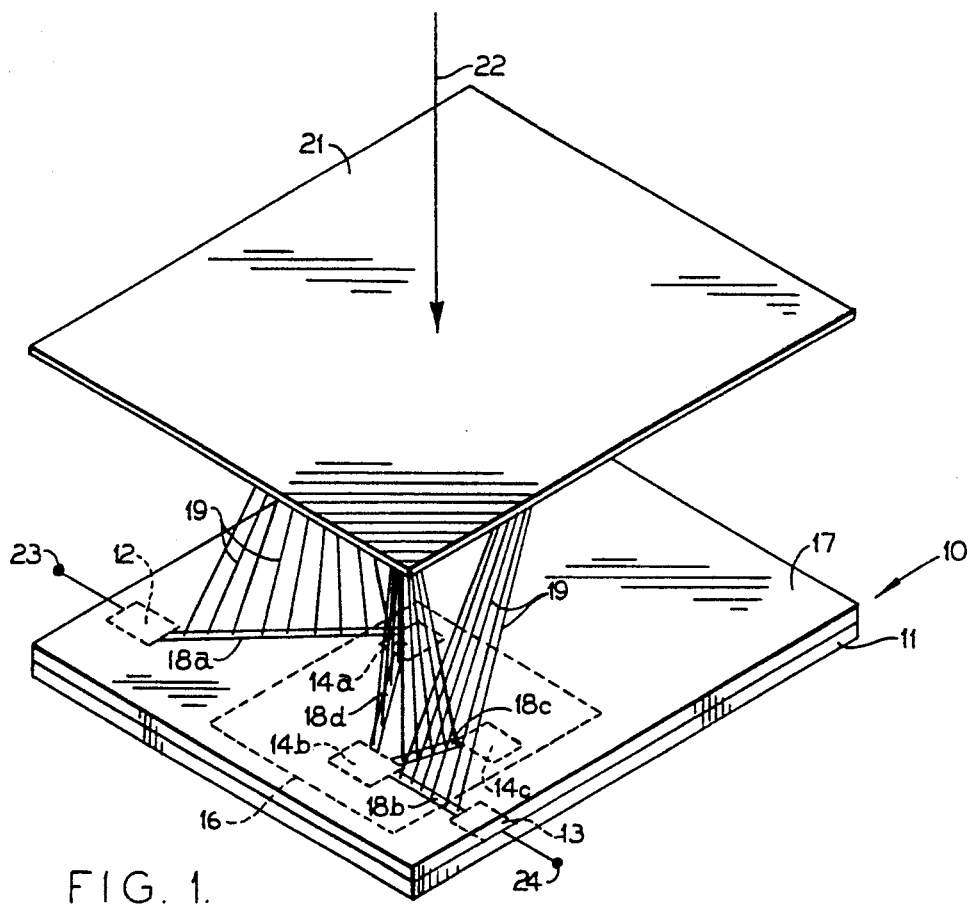
FIG. 1 schematically illustrates an integrated circuit chip having a photoconductive layer thereon which is optically activated by a hologram, according to the present invention.

Referring now to FIG. 1, a schematic illustration of the electro-optical test method and apparatus according to the present invention is provided. As shown in FIG. 1, an integrated circuit chip such as a Ultra-Large Scale Integration (ULSI) chip 10 includes a semiconductor substrate 11 having up to one million or more active devices thereon. The semiconductor substrate 11 includes a test input pad 12 and a test output pad 13. It will be understood by those having skill in the art that test input pad 12 and test output pad 13 may comprise a plurality of pads for parallel input and output of test data and that these pads may also serve other functions when the chip is used in its normal operation after testing. In either Case, semiconductor substrate 11 includes at least one means for receiving test input signals and at least one means for receiving test output signals.

As also shown in FIG. 1, semiconductor substrate 11 includes a plurality of internal test sites 14 in the form of pads, buses or Other well known structures. It will be understood by those having skill in the art that the circuitry on the typical integrated circuit is partitioned to allow access to internal test sites 14 in order to fully test the integrated circuit chip. A ULSI chip might include on the order of one hundred internal partitions which must be accessed during testing. Accordingly, to test a particular partition 16 of chip 10, at least one internal test site 14a must be connected to the test input pad 12 and at least one internal test site 14b must be connected to the output test pad 13. Also, often an internal test site 14b must be electrically connected to another internal test site 14c for test purposes.

Conventional approaches require large numbers of active devices to form these interconnections for testing purposes. After testing was completed, these active devices are no longer needed. Accordingly large area and performance penalties were paid.

According to the invention, testing of the partitioned chip may be accomplished without requiring large numbers of test input pads or test output pads by providing a photoconductive layer 17 (i.e. a layer which becomes electrically conductive in response to optical activation) on the top surface of the semiconductor substrate 11, which photoconductive layer connects the test input pad 12, test output pad 13 and internal test sites 14. Then, electrically conductive paths 18 are optically activated by impinging optical radiation 19 on paths 18.

In particular, as shown in FIG. 1, a holographic optical element 21 having a predetermined hologram thereon is placed adjacent the photoconductive layer 17. A laser or other coherent light source 22 impinges on the hologram to cause the hologram to produce an optical radiation pattern 19 along the desired paths 18 to thereby optically activate these electrically conductive paths. The hologram pattern is designed so that a path 18a is produced in the photoconductive layer 17 to connect test input pad 12 to internal site 14a. Another path 18b is formed to connect test output pad 13 to internal site 14b. Yet another path 18d is activated to connect internal test site 14a to internal test site 14b, and another path 18c is formed to connect test site 14c to 14b. If additional test paths are required the hologram can be programmed to provide them.

Accordingly, in order to test partition 16, hologram 21 is placed adjacent photoconductive layer 17 and laser 22 is activated. Activation of laser 22 causes electrically conductive paths 18a-18d to be formed to thereby connect test input pad 12 and 13 to internal test sites 14. A test input signal is applied to a test input applying means 23, which may be a test probe at a test station, and the output of the test is measured by test output accepting means 24, which may also be a test probe. Laser 22 is then deactivated to deactivate paths 18a-18d. Then, in order to test the remaining partitions on the integrated circuit, second and subsequent holograms are placed adjacent the photoconductive layer 17, and different sets of test inputs are applied to test input applying means 23 and different test outputs are measured by test output applying accepting means 24.

Figure 2:
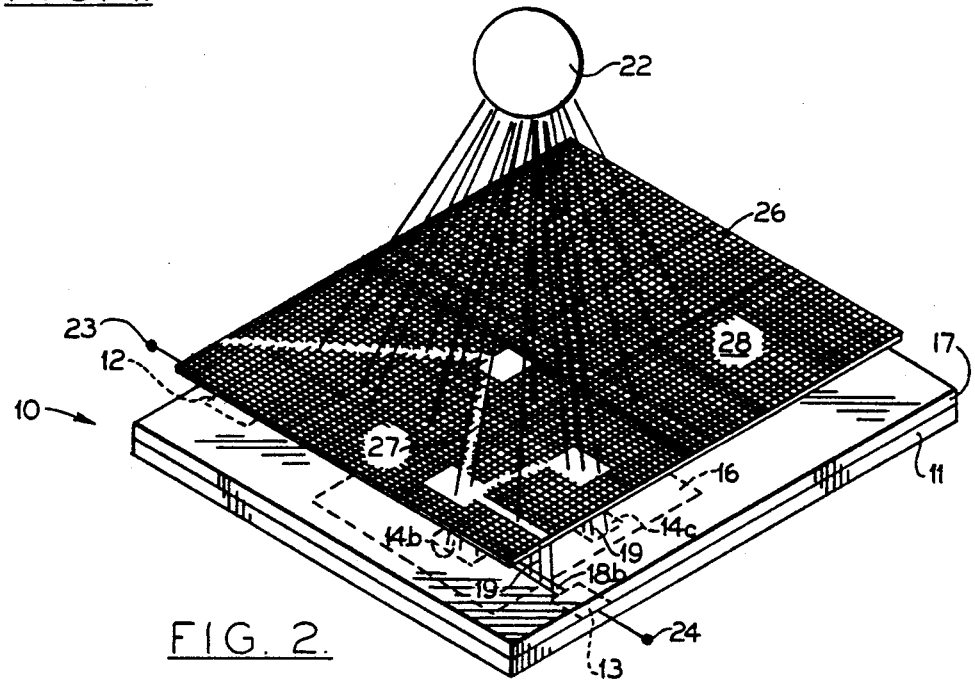
FIG. 2 schematically illustrates an integrated circuit chip having a photoconductive layer thereon which is optically activated by a mask, according to the present invention.

Referring now to FIG. 2, a second embodiment of the present invention will now be described. This embodiment differs from the first embodiment in that a holographic optical element 21 is not used to optically activate the paths 18. Rather, a conventional optical mask 26 is used. The mask includes transparent areas 27 and opaque areas 28. The transparent areas are configured so that when a light source 22 floods the mask, the optical paths 18 are optically activated.

Figure 3A:
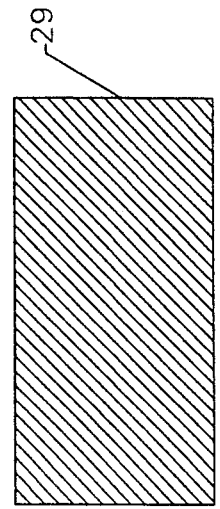

Referring now to FIGS. 3A-3F, 4A-4F and 5A-5F, the steps of fabricating and testing the integrated circuit chip according to the present invention will now be described. FIGS. 3A-3F and 4A-4F illustrate cross-sectional and top views respectively, of the integrated circuit chip and will be referred to together. FIGS. 5A-5F illustrate a top view of an alternative embodiment. As shown in FIGS. 3A, 4A and 5A, integrated circuit chip 10 includes a semiconductor substrate 11 having a test input pad 12 and an internal test site 14 thereon. The test input pad i2 and internal test site 14 are typically defined in, or are connected to, the topmost level of integrated circuit metallurgy. For purposes of simplicity, a single test input pad and internal test site 12 and 14 are shown. However, it will be understood by those having skill in the art that a plurality of internal test sites may be used and a plurality of input and output pads may be used. It will be assumed for purposes of discussion that in order to test a particular partition 16 of the integrated circuit Chip 10, internal test site 14 must be electrically connected to test input pad 12.

Figure 3B:
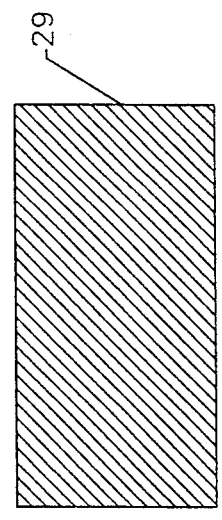
Figure 3C:
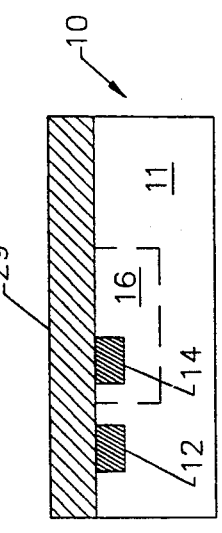
Figure 4A:
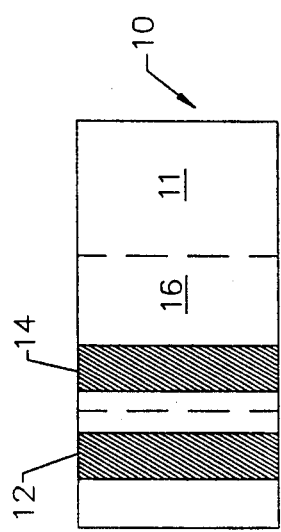
Figure 4B:
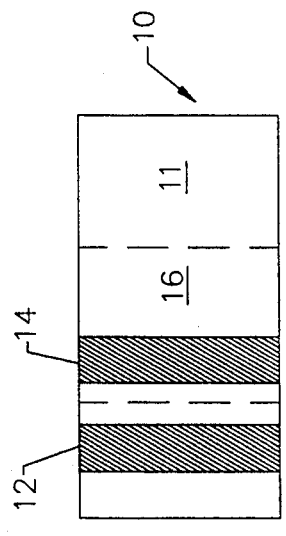
Figure 4C:
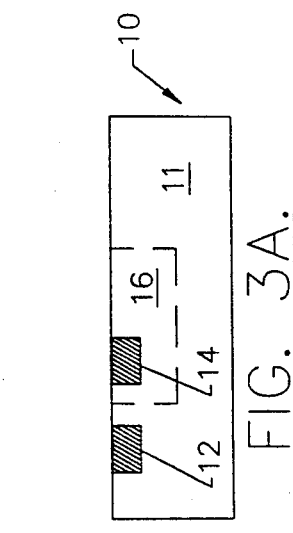
Figure 5A:
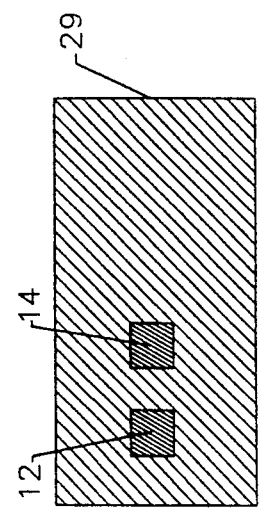
Figure 5B:
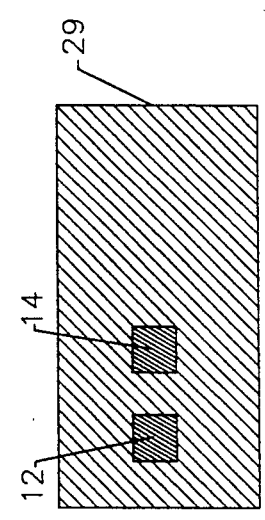

Referring to FIGS. 3B, 4B and 5B, a passivating or insulating layer 29, which in a preferred embodiment is polyimide, is spun or otherwise formed on integrated circuit 10. Then, as shown in FIGS. 3C, 4C and 5C the polyimide layer 29 is patterned to form vias 31 therein and thereby expose the test input pad 12 and internal test site 14. Then, as shown in FIGS. 3D, 4D and 5D, a photoconductive layer 17 is formed on insulating layer 29.

In a preferred embodiment photoconductive layer 17 is hydrogenated amorphous silicon (a-Si:H) which may be formed using techniques well known to those having skill in the art. Amorphous silicon layer 17 is hydrogenated in order to enhance photoconductive sensitivity of the amorphous silicon. Typically a hydrogen concentration of 15–20 atomic percent is preferred. The deposition of a-Si:H is preferably done at low temperatures so that no damage will be imposed on the metallization layers underneath. As is well known to those having skill in the art, the structure and optical properties of a-Si:H are closely linked to the deposition parameters. As is also well known to those having skill in the art, organic or other photoconductive materials can be used for photoconductive layer 17.

In a first embodiment of the invention the hydrogenated amorphous silicon layer 17 is blanket deposited as shown in FIGS. 3D and 4D. However, it will be understood by those having skill in the art that a patterned hydrogenated amorphous silicon layer may be deposited as shown in FIG. 5D. The patterned layer may be formed only at those areas which need be optically activated during later steps.

Then, referring to FIGS. 3E, 4E and 5E, the optical path 18 is formed by applying optical radiation 19 (shown as arrows in FIG. 3E and shown as dots in FIGS. 4E and 5E) to optically activate the desired path 18 and connect input pad 12 and test site 14. As already described, optical radiation may be focused via a hologram or optical mask. As also already described, a plurality of different holograms and masks may be used to optically activate different paths and test different partitions in the integrated circuit.

Finally, referring to FIGS. 3F, 4F and 5F, after all partitions of the integrated circuit have been tested, an opaque encapsulation layer 32 may be applied over the entire photoconductive layer 17 so that it can no longer be photoconductively activated. Alternatively, photoconductive layer 17 may be removed. As another alternative a removable cover may be placed on the photoconductive layer 17 to allow removal and retesting in the field. The tested integrated circuit may then be used for its intended purpose.

As described in FIGS. 3A-3F, 4A-4F and 5A-5F, photoconductive layer 17 is formed On top of semiconductor substrate 11 so that it does not occupy valuable real estate on the semiconductor substrate. The photoconductive layer does not use discrete photodiodes which take up chip area and impede performance. Accordingly, testing of internal sites in the partitioned chip may be provided with minimal area overhead.

Figure 6:
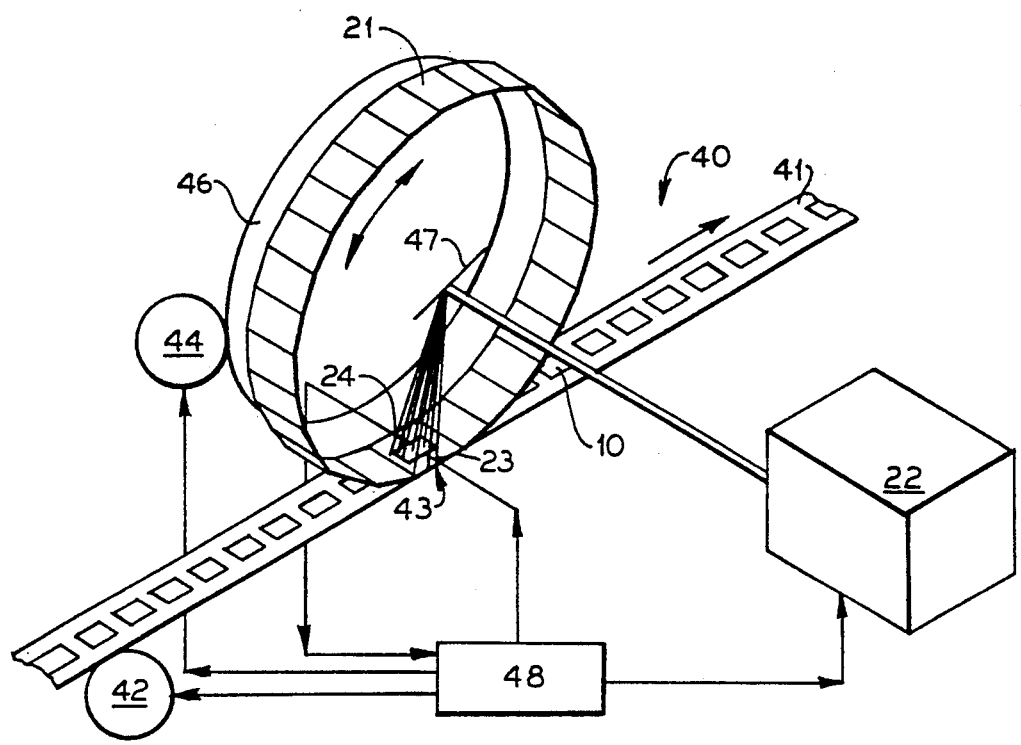
FIG. 6 schematically illustrates an integrated circuit testing apparatus according to the present invention.

Referring now to FIG. 6, a tester for testing integrated circuits according to the present invention will now be described. As shown, tester 40 includes a transport 41 driven by a motor 42 or other means, for moving an integrated circuit chip 10 past a test station 43. One of a plurality of masks 21, which may be conventional optical masks or holograms or combinations thereof, is moved adjacent the test station 43 by a mask drive motor 44. As shown in FIG. 6 the requisite number of masks 21 for complete testing of partitions in the integrated circuit 10 may be supported on a circular support 46. Alternatively, the masks 21 may be stacked and selected using a robotic arm or other conventional means. A laser 22 or other light source is provided, and a deflector such as a mirror 47 may be provided to deflect the incoming light beam through the mask 21 adjacent station 43. Station 43 also includes an input test applying means or probe 23 and an output accepting means or probe 24. A controller 48, which may be a microprocessor or other well known controller, is electrically connected to the light source 22, transport motor 42, mask motor 44, test input applying probe 23 and test output accepting probe 24, to control and coordinate their operation.

Operation of the apparatus of FIG. 6 is as follows: The integrated circuits 10 to be tested have had photoconductive layers applied thereto during their manufacture as already described in connection with FIGS. 3A-3D, 4A-4D, and 5A-5D. Controller 48 moves an integrated circuit 10 to test station 43. A first mask 21 is moved adjacent the test station under control of controller 48, and light source 22 is activated in order to optically activate the appropriate paths in the photoconductive layer. Controller 48 applies appropriate test inputs to the test input pad 12 on the integrated circuit 10 via the test input applying probe 23, and test output measurements are obtained from test output pad 13 via test output accepting probe 24. The light source 22 is the deactivated.

Controller 48 may then evaluate the results of the tests, and if the tests indicate that the chip is defective, further testing may be inhibited. If the chip passes the test, the controller may move the next in the series of masks 21 adjacent the testing station 24 by activating mask motor 44 to move the circular array clockwise or counterclockwise, and then may apply a new series of test inputs to the new partition to be tested. This process is repeated for each mask and each series of test inputs and test outputs until all partitions in the chip are tested. Then, controller 48 moves transport 42 to bring the next chip 10 into test station 43.

It will be understood by those having skill in the art that, according to the invention, each integrated circuit partition to be tested will typically require a separate mask 21. If the number of partitions becomes excessive, the fabrication cost for the masks may become excessive and the testing time for each chip may become excessively long. However, it will be understood by those having skill in the art that the method and apparatus of the present invention may be combined with other known chip testing techniques to provide hybrid testing techniques. One illustration of this combination will now be described in connection with FIGS. 7 and 8.

Figure 7:
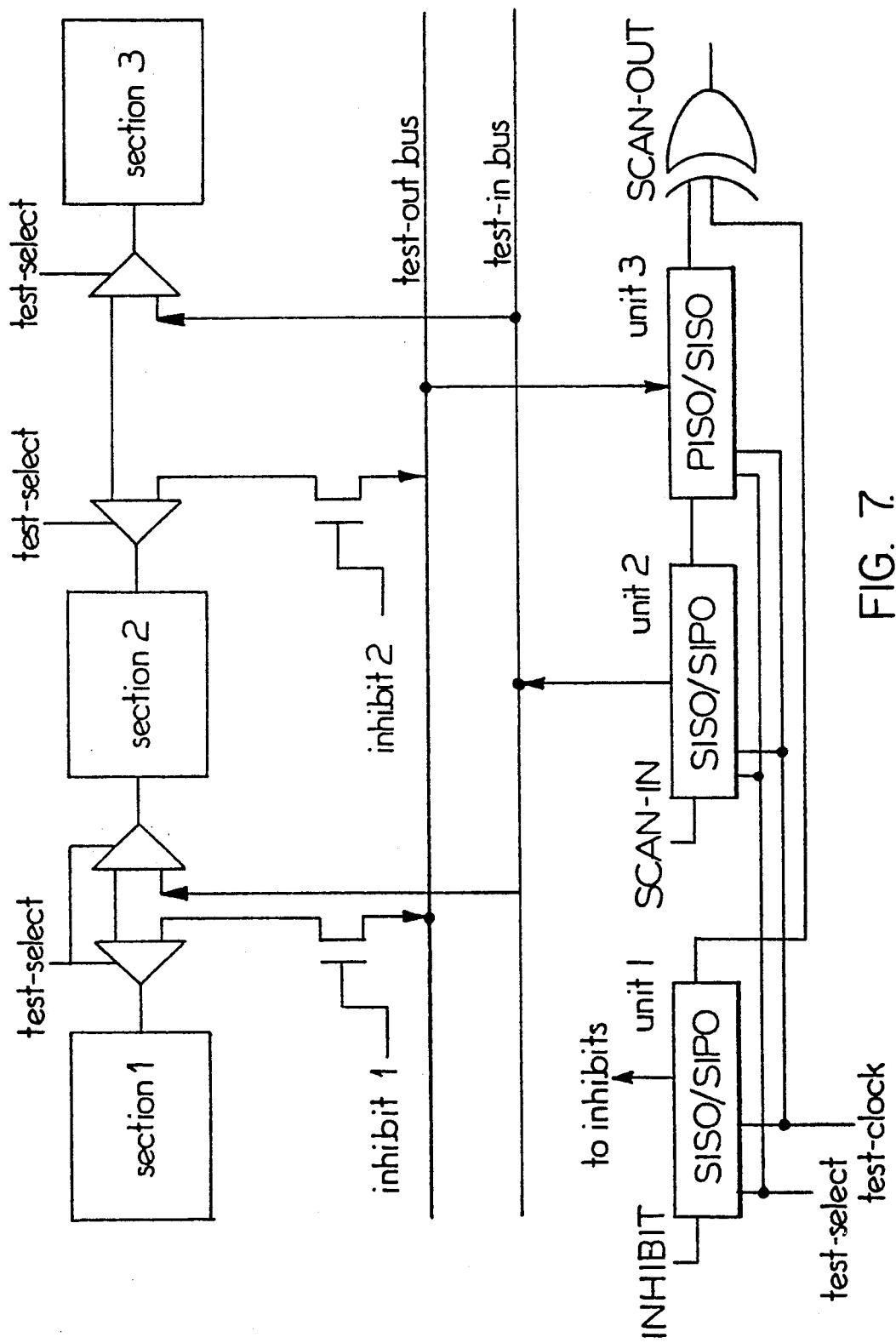
FIG. 7 illustrates a partitioning technique for testing an integrated circuit.

Referring to FIG. 7, an integrated circuit chip which is partitioned using a "time shared boundary scan" is illustrated. The partitioning of an integrated circuit chip with a time shared boundary scan is described in a publication entitled *"Practical Partitioning For Testability With Time-Shared Boundary Scan"*, published in The Proceedings of the 1990 IEEE Test Conference, Sep. 1990, paper 42.3 , pp. 970–977 by coinventor Makki et al., the disclosure of which is hereby incorporated herein by reference. FIG. 7 corresponds to FIG. 5B of the aforementioned Makki et al. publication. As shown in FIG. 7, the integrated circuit is partitioned into "sections" and access is provided to each section via an internal boundary scan. The boundary scan is centered around an input test bus and an output test bus which are time shared by the various sections. In this manner, the number of scanned latches in the boundary scan is reduced and the test time is accelerated. The "inhibit" inputs allow the sections to access the "test buses" on a time shared basis. For example, asserting "inhibit1" and deasserting all other inhibit inputs allows section 1 to control the test-out bus.

The time shared boundary scan is divided into three shift registers which are typically composed of d-type flip-flops. Each register can be configured by the "test-select" input into one of two modes of operation. For example, "unit 3" can be configured as a parallel in, serial out (PISO) or serial in, serial out (SISO). "Unit 1" provides the inhibit inputs, "unit 2" controls the "test-in" bus and "unit 3" allows for observing the "test-out" bus. The "SCAN-OUT" exclusive OR-gate is used to reduce the number of observation points by allowing single faults to propagate from any of its inputs to the output regardless of the logic value on the other input. As shown in FIG. 7 a total of five primary test points are required: INHIBIT input, SCAN-IN input, test-select input, test-clock input, and SCAN-OUT output. Further details of the time shared boundary scan technique need not be described further herein.

Figure 8:
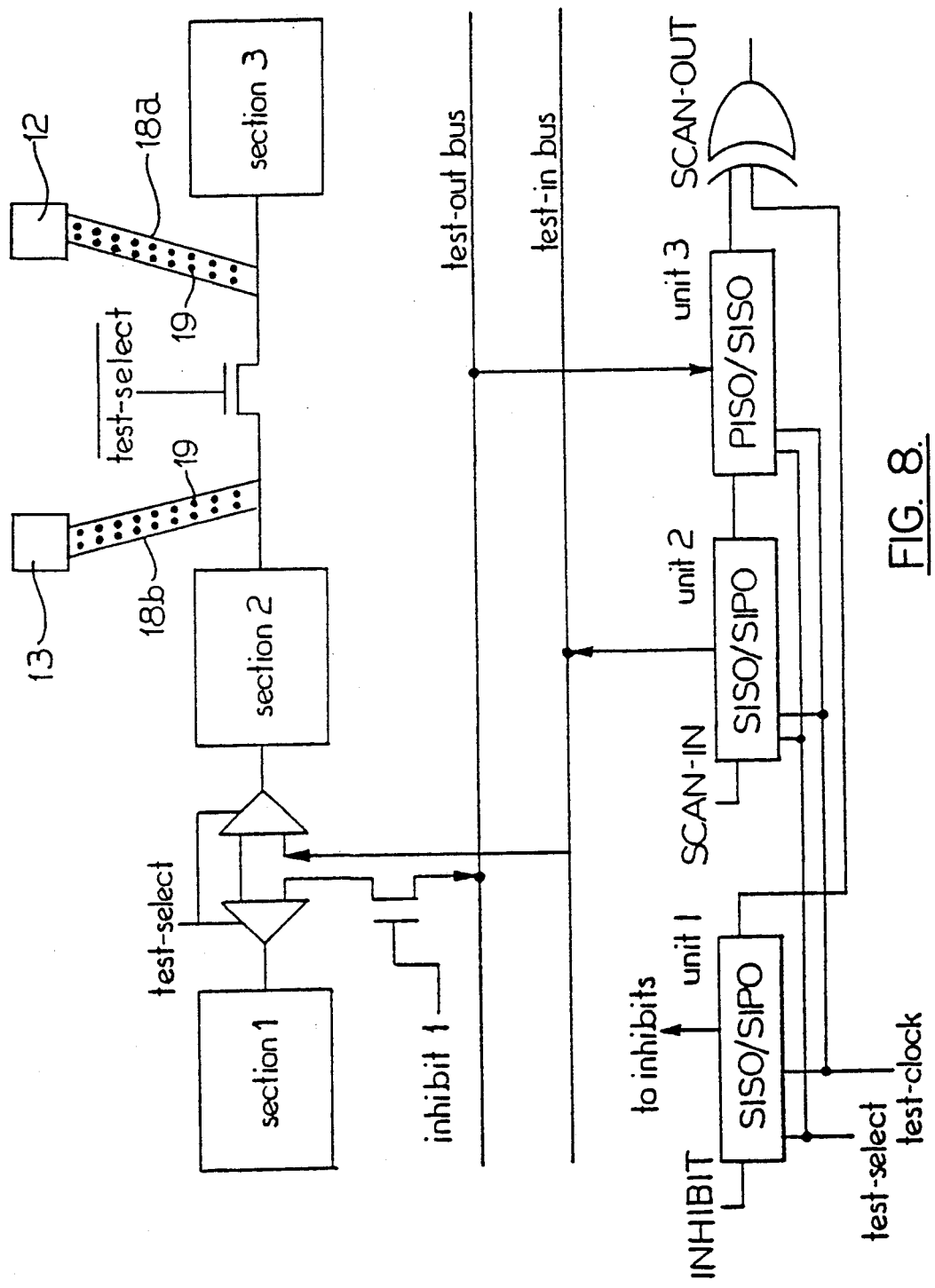
FIG. 8 illustrates application of the present invention to the partitioning technique of FIG. 7.

Referring now to FIG. 8, it is shown how the optically activated layer of the present invention may be used to test section 2 and section 3 of FIG. 7. As shown in FIG. 8, a first electrically conductive path 18a may be formed between the input of section 3 and a test input receiving pad 12, with the path being optically activated by light 19. Using another mask, the output of section 2 may be electrically connected to test output receiving pad 13 via path 18b. Accordingly, the test-in bus and test-out bus are not used for applying test input signals to section 3 or for receiving test output signals from section 2, thereby minimizing capacitive loading on sections 2 and 3. When testing section 2 or section 3 using the optically activated paths, the test-select gate is used to decouple section 3 from section 2. It will be understood by those having skill in the art that the optically activated path of the present invention may be substituted for other test circuitry and even for the test-in and test-out buses. Accordingly, partitioning and testing techniques may be combined with the technique of the present invention to provide an optimum combination of numbers of masks, circuit overhead testing time, and circuit performance.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is
1. An integrated circuit comprising;
   a plurality of electronic devices for performing integrated circuit functions;
   a plurality of internal test sites for providing electrical connections to selected ones of said electronic devices; and
   a solid photoconductive interconnect layer being free of diodes, for photoconductively interconnecting said plurality of internal test sites to provide optically activatable electrical interconnection of selected ones of said internal test sites;
   wherein said solid photoconductive interconnect layer comprises an insulating layer having a plurality of vias therein for exposing said plurality of internal test sites, and a photoconductive layer on said insulating layer; and wherein said photoconductive layer fills said vias and connects the filled vias to one another;
   whereby testing of said plurality of electronic devices is facilitated.

2. The integrated circuit of claim 1 wherein said photoconductive layer comprises a layer of hydrogenated amorphous silicon.

3. The integrated circuit of claim 1 wherein said photoconductive layer comprises a layer of amorphous silicon.

4. The integrated circuit of claim 1 in combination with a mask adjacent said solid photoconductive interconnect layer and an optical source adjacent said mask, opposite said solid photoconductive interconnect layer, for optically activating selected portions of said solid photoconductive interconnect layer.

5. The integrated circuit of claim 4 wherein said mask comprises a holographic optical element, and wherein said optical source comprises a laser.

6. The integrated circuit of claim 4 wherein said mask comprises an optical mask.

7. A method for testing an integrated circuit having a plurality of internal test sites, comprising the steps of:
   forming an insulating layer on said integrated circuit, said insulating layer having a plurality of vias thereon for exposing the plurality of internal test sites;
   forming a solid photoconductive interconnect layer on said insulating layer, said solid photoconductive interconnect layer filling said vias and photoconductively connecting the plurality of internal test sites, said solid photoconductive interconnect layer being free of diodes;
   optically activating selected portions of the solid photoconductive interconnect layer to thereby electrically connect the selected ones of the internal test sites; and
   electrically testing the integrated circuit using the electrically connected selected ones of the internal test sites.

8. The method of claim 7 wherein said optically activating step comprises the steps of:
   placing a first mask adjacent said integrated circuit, the first mask being configured to optically activate the selected portions of the solid photoconductive interconnect layer in response to optical radiation incident thereto; and
   optically irradiating the first mask.

9. The method of claim 8 wherein said placing step comprises the step of placing a first holographic optical element adjacent said integrated circuit, and wherein said optically irradiating step comprises the step of irradiating the first holographic optical element with a laser.

10. The method of claim 7 wherein said forming a solid photoconductive interconnect layer step comprises the step of depositing a layer of hydrogenated amorphous silicon.

11. The method of claim 7 further comprising the step of terminating the optical activation of the selected portions of the solid photoconductive interconnect layer to thereby electrically disconnect the selected ones of the internal test points.

12. An integrated circuit comprising:
   a plurality of electronic devices for performing predetermined integrated circuit functions;
   a plurality of internal test sites for providing electrical connections to selected ones of said electronic devices;
   means for receiving test input signals;

means for receiving test output signals; and a solid photoconductive interconnect layer being free of diodes, for photoconductively connecting said test input receiving means, said test output receiving means and said plurality of internal test sites, such that selected portions of said solid photoconductive interconnect layer may be optically activated to electrically connect said test input receiving means and said test output receiving means with selected ones of said internal test locations, for testing purposes;

wherein said solid photoconductive interconnect layer comprises an insulating layer having a plurality of vias therein for exposing said test input receiving means, said test output receiving means and said plurality of internal test sites, and a photoconductive layer on said insulating layer, said photoconductive layer filling said vias and connecting the filled vias to one another.

13. The integrated circuit of claim 12 wherein said photoconductive layer comprises a patterned photoconductive layer.

14. The integrated circuit of claim 12 wherein said photoconductive layer comprises a layer of hydrogenated amorphous silicon.

15. The integrated circuit of claim 12 wherein said photoconductive layer comprises a layer of amorphous silicon.

16. The integrated circuit of claim 12 wherein said plurality of electronic devices are arranged in a plurality of partitions, and wherein said plurality of internal test sites provide electrical connections to each of said plurality of partitions.

17. The integrated circuit of claim 12 wherein said plurality of test sites comprise at least one test bus.

18. The integrated circuit of claim 12 wherein said test input receiving means comprises a test input pad and wherein said test output receiving means comprises a test output pad.

19. The integrated circuit of claim 12 in combination with a mask adjacent said solid photoconductive interconnect layer and an optical source adjacent said mask, opposite said solid photoconductive interconnect layer, for optically activating selected portions of said solid photoconductive interconnect layer.

20. The integrated circuit of claim 19 wherein said mask comprises a holographic optical element, and wherein said optical source comprises a laser.

21. The integrated circuit of claim 19 wherein said mask comprises an optical mask.

22. The integrated circuit of claim 12 wherein said plurality of electronic devices comprise at least one of logic and memory devices.

23. An integrated circuit comprising a plurality of electronic devices for performing predetermined integrated circuit functions;

a plurality of internal test sites for providing electrical connections to selected ones of said electronic devices;

means for receiving test input signals;

means for receiving test output signals; ad a solid photoconductive interconnect layer for photoconductively connecting said test input receiving means, said test output receiving means and said plurality of internal test sites, such that selected portions of said solid photoconductive interconnect layer may be optically activated to electrically connect said test input receiving means and said test output receiving means with selected ones of said internal test locations, for testing purposes;

wherein said solid photoconductive interconnect layer comprises an insulating layer having a plurality of vias therein for exposing said test input receiving means, said test output receiving means and said plurality of internal test sites, and a photoconductive layer on said insulating layer, said photoconductive layer filling said vias and connecting the filled vias to one another.

24. The integrated circuit of claim 23 wherein said solid photoconductive interconnect layer comprises a pattered photoconductive layer.

25. The integrated circuit of claim 23 wherein said solid photoconductive interconnect layer comprises a layer of hydrogenated amorphous silicon.

26. The integrated circuit of claim 23 wherein said solid photoconductive interconnect layer comprises a layer of amorphous silicon.

27. The integrated circuit of claim 24 in combination with a mask adjacent said solid photoconductive interconnect layer and an optical source adjacent said mask, opposite said solid photoconductive interconnect layer, for optically activating selected portions of said solid photoconductive interconnect layer.

28. An integrated circuit comprising:

a plurality of electronic devices for performing integrated circuit functions;

a plurality of internal test sites for providing electrical connections to selected ones of said electronic devices; and a solid photoconductive interconnect layer for photoconductively interconnecting said plurality of internal test sites to provide optically activatable electrical interconnection of selected ones of said internal test sites;

wherein said solid photoconductive interconnect layer comprises an insulating layer having a plurality of vias therein for exposing said plurality of internal test sites, an a photoconductive layer on said insulating layer; and wherein said solid photoconductive interconnect layer fills said vias and connects the filled vias to one another.

29. The integrated circuit of claim 28 wherein said solid photoconductive interconnect layer comprises a layer of hydrogenated amorphous silicon.

30. The integrated circuit of claim 28 wherein said solid photoconductive interconnect layer comprises a layer of amorphous silicon.

31. The integrated circuit of claim 28 in combination with a mask adjacent said solid photoconductive interconnect layer and an optical source adjacent said mask, opposite said solid photoconductive interconnect layer, for optically activating selected portions of said solid photoconductive interconnect layer.

32. A method for testing an integrated circuit having a plurality of electronic devices, a plurality of internal test sites for providing electrical connections to selected ones of the electronic devices, test input receiving means and test output receiving means, said method comprising the steps of:

forming an insulating layer on said integrated circuit, said insulating layer having a plurality of vias therein for exposing the plurality of internal test sites, the test input receiving means and the test output receiving means;

forming a solid photoconductive interconnect layer on said insulating layer, said solid photoconductive interconnect layer being free of diodes, said solid photoconductive interconnect layer filling said vias and photoconductively connecting the plurality of internal test sites, the test input receiving means and the test output receiving means;

optically activating a first portion of said solid photoconductive interconnect layer to form first electrical connections among the test output, the test output and first selected ones of the internal test sites;

testing the electronic devices which are connected to the first internal test sites by applying test inputs to selected ones of the first internal test sites via the test input receiving means, and measuring the test results from selected ones of the first internal test sites via the test output receiving means; and repeating said optically activating and testing steps for second and subsequent portions of the solid photoconductive interconnect layer and second and subsequent selected ones of the internal test sites.

33. The method of claim 32 wherein said optically activating step comprises the steps of:

lacing a first mask adjacent said solid photoconductive interconnect layer, the first mask being configured to permit optical radiation to pass therethrough to said first portion of said solid photoconductive interconnect layer; and optically irradiating the first mask.

34. The method of claim 33 wherein said placing step comprises the step of placing a first holographic optical element adjacent said solid photoconductive interconnect layer, and wherein said optically irradiating step comprises the step of irradiating the first holographic optical element with a laser.

35. The method of claim 33 wherein said repeating said optically activating step comprises the steps of placing second and subsequent masks adjacent said solid photoconductive interconnect layer to produce optical radiation on said second and subsequent portions of said solid photoconductive interconnect layer respectively; and optically irradiating the second and subsequent masks.

36. The method of claim 32 wherein said solid photoconductive interconnect layer forming step comprises the step of depositing a layer of hydrogenated amorphous silicon.

37. The method of claim 32 wherein said solid photoconductive interconnect layer forming step comprises the step of blanket depositing a photoconductive layer.

38. The method of claim 32 wherein said testing step is followed by the step of:

terminating the optical activation of the first portion of said solid photoconductive interconnect layer to thereby electrically disconnect the plurality of internal test sites, the test input receiving means and the test output receiving means; and wherein said repeating step comprises the step of repeating said optically activating, testing and terminating steps.

39. An apparatus for testing integrated circuits having a plurality of internal test sites, test input receiving means, and test output receiving means, an insulating layer on said integrated circuit having a plurality of vias therein for exposing said internal test sites, said test input receiving means and said test output receiving means, and a solid photoconductive interconnect layer being free of diodes, on said insulating layer and filling said vias, for photoconductively connecting said internal test sites, said test input receiving means and said test output receiving means, said apparatus comprising:

a test station for receiving an integrated circuit to be tested;

means for applying test inputs to a test input receiving means of an integrated circuit at said test station;

means for accepting test outputs from a test output receiving means of an integrated circuit at said test station;

a plurality of masks, each of which is patterned to optically activate a predetermined portion of said solid photoconductive interconnect layer including the filled vias to electrically connect selected ones of the internal test sites to the test input receiving means and the test output receiving means upon optical irradiation of the mask;

means for placing one of said plurality of masks adjacent said solid photoconductive interconnect layer;

means for optically irradiating a mask to thereby optically activate the associated predetermined portion of said solid photoconductive interconnect layer including the associated filled vias; and electronic controlling means, operationally connected to said applying, accepting, placing and irradiating means, said electronic controlling means comprising:

means for selecting one of said plurality of masks for placement adjacent the solid photoconductive interconnect layer of an integrated circuit at said test station;

means for activating said optical irradiating means, to thereby electrically connect selected ones of said internal test sites to the test input receiving means and the test output receiving means;

means for generating test inputs associated with the selected mask and for directing the generated test inputs to said test input applying means; and means for evaluating test outputs from said test output accepting means to determine whether an integrated circuit at said test station is defective.

40. The testing apparatus of claim 39 wherein said plurality of masks comprise a plurality of holographic optical elements, and wherein said optical irradiating means comprises a laser.

41. The testing apparatus of claim 39 wherein said plurality of masks comprise a plurality of optical masks.

42. The testing apparatus of claim 39 wherein said electronic controlling means further comprises means for deactivating said optical irradiating means, to thereby electrically disconnect selected ones of said internal test sites from the test input receiving means and the test output receiving means.

* * * * *